United States Patent
Crowley et al.

[19]

[11] Patent Number: 6,057,739
[45] Date of Patent: May 2, 2000

[54] PHASE-LOCKED LOOP WITH VARIABLE PARAMETERS

[75] Inventors: Matthew P. Crowley, San Jose; Mark G. Johnson, Los Altos, both of Calif.

[73] Assignee: Advanced Micro Devices, Inc., Sunnyvale, Calif.

[21] Appl. No.: 08/938,183

[22] Filed: Sep. 26, 1997

[51] Int. Cl.[7] .............................. H03L 7/089; H03L 7/093
[52] U.S. Cl. ................................. 331/14; 331/17; 331/25
[58] Field of Search .................................. 331/14, 17, 25

[56] References Cited

U.S. PATENT DOCUMENTS

| | | | |
|---|---|---|---|
| 5,151,665 | 9/1992 | Wentzler | 331/25 |
| 5,276,408 | 1/1994 | Norimatsu | 331/17 |
| 5,339,050 | 8/1994 | Llewellyn | 331/17 |
| 5,404,250 | 4/1995 | Hase et al. | 331/25 |
| 5,631,587 | 5/1997 | Co et al. | 331/25 |
| 5,831,483 | 11/1998 | Fukuda | 331/17 |

OTHER PUBLICATIONS

Digital Integrated Circuits, A Design Perspective; Jan M. Rabaey; Prentice Hall Electronics and VLSI Series; ©1996 by Prentice–Hall, Inc.; Upper Saddle River, New Jersey 07458; pp. 538–545.

*Primary Examiner*—Siegfried H. Grimm
*Attorney, Agent, or Firm*—Skjerven, Morrill, MacPherson, Franklin & Friel, LLP; Kent B. Chambers

[57] ABSTRACT

An electronic system such as a processor or computer system includes a phase-locked loop (PLL) having a PLL parameter modification circuit. In one embodiment, the PLL parameter modification circuit may be programmed to provide one of several current control signals to a charge pump. Additionally, the PLL parameter modification circuit may be programmed to alter a loop filter transfer function by selectively changing resistance and/or capacitance values of the loop filter. Each current control signal modifies the charge pump output control voltage to a VCO differently, and, thus, modifying the current control signals to the charge pump effectively modifies the bandwidth of the PLL. In one embodiment, the PLL parameter modification circuit modifies current control signals to the charge pump by selectively inserting and removing, in accordance with programmable register bit(s) states, diode configured transistors in a current mirror configuration. Thus, a ratio of the output current of the current mirror i.e. the current control signals, to a current reference signal may be programmably modified to modify the bandwidth and lock time parameters of the PLL. The PLL parameter modification may modify the resistive and capacitive parameters of the loop filter by selecting configuring multiple resistors and capacitors to form one of many equivalent circuits.

22 Claims, 5 Drawing Sheets

PHASE-LOCKED LOOP WITH VARIABLE PARAMETERS

BACKGROUND OF THE INVENTION

1. Field of the Invention

This invention relates to electronic systems and more particularly relates to electronic systems which include computer systems and processors having a phase-locked loop parameter modification circuit to vary parameters of the phase-locked loop.

2. Description of the Related Art

Electronic systems such as computer systems have become ubiquitous. Computer systems typically include one or more processors and a bus to connect each processor to each other, if applicable, to memory, and to various input/output devices. These components of the computer system and other computer system circuitry typically include integrated circuitry which responds to an external clock signal supplied to the processor.

Figure 1:
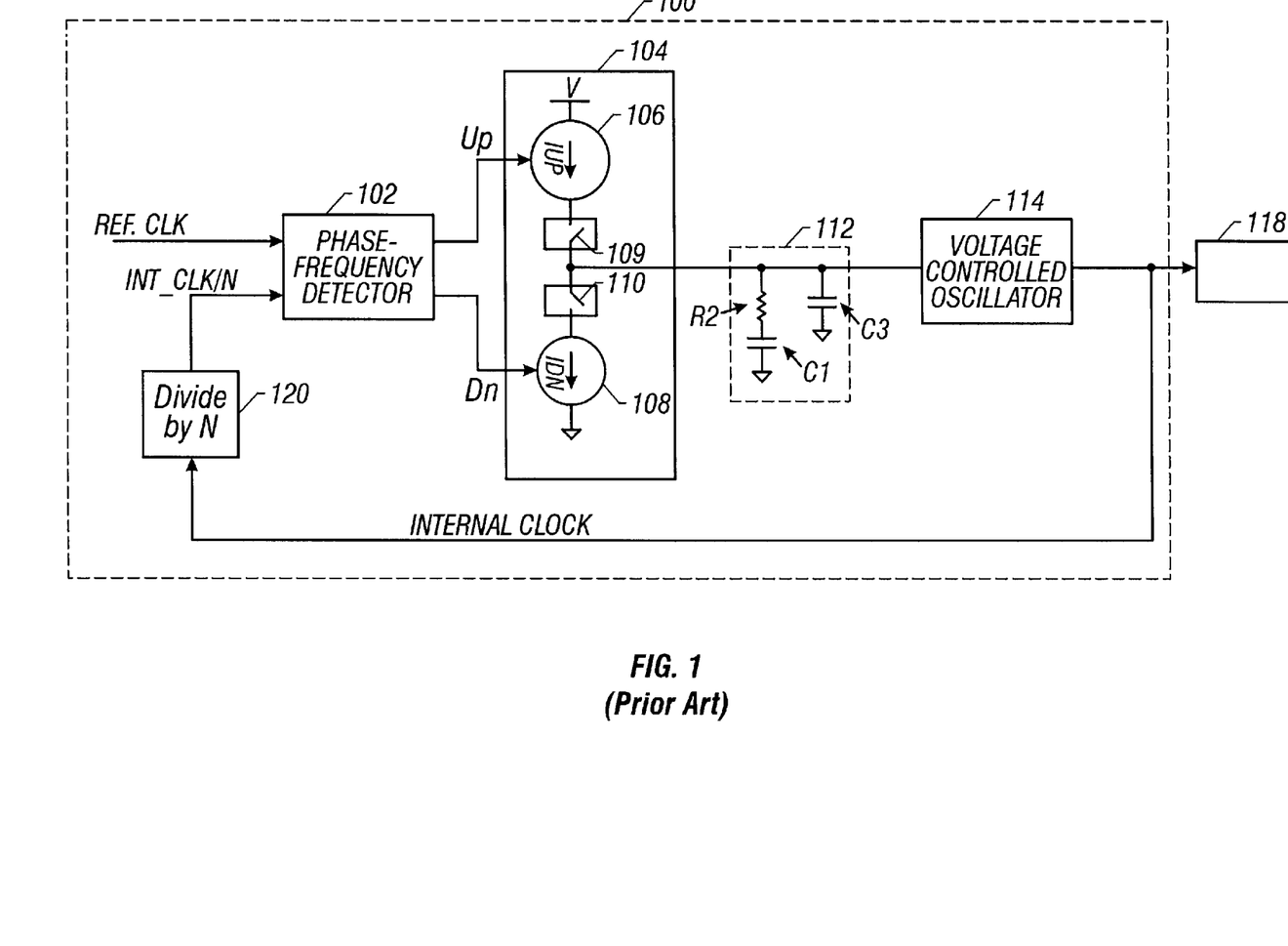
FIG. 1, labeled prior art, is a phase-locked loop circuit.

Referring to FIG. 1, to provide a well-defined clock signal for clocked integrated circuitry, a phase-locked loop (PLL) circuit 100 synchronizes edges of an internal clock signal with respect to edges of an external reference clock signal (REF. CLK). A phase-frequency detector 102 detects a phase difference between the external REF. CLK signal and the output signal (INT_CLK/N) of divide by N circuit 120, where the INTERNAL CLOCK signal frequency is N times greater than the REF. CLK signal frequency. The phase detector 102 provides an Up current control signal to the charge pump 104 to increase the frequency of INT_CLK/N when the INT_CLK/N signal lags the REF. CLK signal. The phase detector 102 provides a Dn current control signal to the charge pump 104 to decrease the frequency of INT_CLK/N when the INT_CLK/N signal leads the REF. CLK signal.

The charge pump 104 responds to the selected current control signal (Up or Dn) of the phase detector 102 by converting the current control signal into a voltage stored by capacitors C1 and C3 of loop filter 112. The charge pump 104 includes switch 109 to source current IUP to loop filter 112 and switch 110 to sink current IDN from loop filter 112. Control signal IDN maintains a fixed value resulting from connecting switch 110 to ground, and control signal IUP maintains a fixed value resulting from connecting switch 109 to a positive voltage source. Accordingly, when current IDN is provided to loop filter 112, an output voltage control signal to voltage controlled oscillator (VCO) 114 decreases, and, when current IUP is provided to loop filter 112, the output voltage control signal to VCO 114 increases.

The output voltage control signal of charge pump 104 is low pass filtered by loop filter 112 and provided to VCO 114. VCO 114 increases and decreases an output internal clock signal frequency with an increased and decreased, respectively, voltage signal from charge pump 104. The INTERNAL CLOCK signal from VCO 114 is fed back through the divide by N circuit 120 as signal INT_CLK/N. The INTERNAL CLOCK signal is also fed to integrated circuitry 118.

The PLL 100 has several parameters which limit operational functionality. One of these parameters is the bandwidth of the PLL 100. The bandwidth of the VCO 114 refers to a maximum frequency difference between the REF. CLK and INT_CLK/N signals which results in a phase change between the REF. CLK and INT_CLK/N signals beyond which the PLL 100 cannot adequately adjust its output signal frequency in time to compensate for the frequency difference. Another important related parameter is the lock-time which refers to the time required by the PLL 100 to adjust its output signal frequency in response to frequency differences between the REF. CLK signal and the INT_CLK/N signal. Another loop parameter of interest is "clock jitter" which refers to oscillation around a target frequency before being sufficiently damped to provide a well-defined clock state. Clock jitter is undesirable since it dynamically varies the time available for logic computation by integrated circuitry 118.

Increasing the bandwidth of PLL 100 to react to large frequency differences between the REF. C LK signal and the INT_CLK/N signal may result in increased noise in a circuit incorporating PLL 100 and decreased PLL 100 resolution i.e. the ability of the PLL 100 to react to small frequency differences.

SUMMARY OF THE INVENTION

During, for example, a design stage of a clocked integrated circuit, an optimal tradeoff between PLL resolution and bandwidth may be undetermined. Additionally, for example, an integrated circuit and/or an external reference clock signal may change, thus, potentially altering a previously determined optimal tradeoff between PLL resolution and bandwidth. Furthermore, other PLL parameters such as clock jitter and lock time may be altered to provide a more optimum PLL performance. Thus, in one embodiment, it is desirable to provide an electronic system with a PLL having variable PLL loop parameters.

In one embodiment of the present invention, a charge pump of a PLL includes a programmable current source that provides control currents Iup and Idn to a charge pump. The current source may be programmed to increase or decrease the Iup and Idn currents in response to bandwidth and resolution requirements. In another embodiment, the PLL includes a loop filter having variable parameters which affect, for example, PLL bandwidth, lock time, and clock jitter. In one embodiment, the PLL is utilized in a processor, and the processor may be a component of a larger electronic system having one or more processors, a memory, display, and peripheral units coupled to the processor.

BRIEF DESCRIPTION OF THE DRAWINGS

Features appearing in multiple figures with the same reference numeral are the same unless otherwise indicated.

DETAILED DESCRIPTION OF THE PREFERRED EMBODIMENTS

The following description of the invention is intended to be illustrative only and not limiting.

The following abbreviations are utilized herein unless indicated otherwise:

PLL—phase-locked loop;
VCO—voltage controlled oscillator;
ID—drain current;
Qx—transistor x;
PCLK—processor clock signal PCLK; and
BCLK—reference clock signal BCLK.

Electronic systems often utilize a PLL to provide a well-defined internal clock signal which is synchronized to an external reference clock signal. Various PLL parameters affect the functionality of the PLL such as the PLL bandwidth. In one embodiment, an electronic system that, for example, includes one or more processors, utilizes a PLL with a PLL parameter modification circuit. The PLL parameter modification circuit modifies selected PLL parameters to provide flexibility in circuit design and allows, for example, selection of optimal PLL parameters within the resolution of the modification parameters. In one embodiment, the PLL parameter modification circuit includes a programmable current source which receives data to select specific control current parameters. The control currents, referred to as Iup and Idn, are appropriately selected by phase-frequency detector (PFD) control signals Up and Dn. The charge pump supplies the Iup and Idn control currents to a loop filter which generates a corresponding VCO voltage control signal. The charge pump VCO voltage control signal determines an output signal frequency of the VCO. By selectively varying the output control signals of the charge pump, the bandwidth and resolution of the PLL may be correspondingly modified.

Additionally, in one embodiment, a PLL parameter modification circuit may also include a variable parameter loop filter in combination with the programmable current source or independently. In one embodiment, PLL 204 has the characteristics of a second order control system, and, generally, six PLL parameters affect PLL 204 operation. The six parameters are charge pump current Ipump (the selected one of Iup and Idn), Kosc (VCO gain in MHz/Volt), Z (VCO output signal frequency divisor), M (PLL feedback signal divisor), C1 (loop filter capacitance—FIG. 4B), and R2 (loop filter resistance—FIG. 4B). The PLL natural frequency ($\omega n$) and damping factor ($\zeta$) parameters are related to these six PLL parameters by:

$$\omega n = \sqrt{\frac{(Ipump)Kosc}{2\pi MZ(C1)}}; \quad \text{and} \quad \text{[Equation 1]}$$

$$\zeta = \frac{(\omega n)(\tau)}{2}, \quad \text{where } \tau = R2 * C1. \quad \text{[Equation 2]}$$

The VCO gain Kosc is generally fixed. The signal frequency divisors M and Z are generally dictated by operational frequency requirements and a reference clock signal at an input terminal to PFD 306, such as an externally supplied reference clock signal BCLK/P at the output terminal of divide by P circuit 302, wherein P is an integer such as 2. However, in various embodiments, a parameter modification circuit responds to supplied data signals to modify control current Ipump, resistance R2, and capacitance C1. By varying control current Ipump, resistance R2, and capacitance C1, PLL long term jitter, operating range and stability, lock time, and loop bandwidth may be optimized. Long term jitter refers to the maximum phase misalignment between a reference signal and a feedback signal for which the PLL can adjust. Increasing the PLL 204 natural frequency $\omega n$ causes the long term jitter parameter of PLL 204 to decrease and decreasing resistor R2 decreases the long term jitter parameter. The operating range and stability of the PLL 204 refer to the lowest frequency of the reference signal at which the PLL 204 can maintain phase lock between the reference signal and the feedback signal, and stability refers to the ability of the PLL 204 to obtain the phase lock. Increasing the natural frequency $\omega n$ of PLL 204 increases the lowest frequency of the reference signal at which the 204 can lock so operating range decreases. Decreasing R2 also decreases the operating range of PLL 204.

The lock time refers to the time taken by the PLL 204 to lock onto the reference signal. Increasing natural frequency (on decreases the lock time, and increasing the damping factor $\zeta$ generally decreases lock time. The bandwidth of the PLL refers to a maximum frequency difference between the reference clock and feedback signals which results in a phase change between the reference clock and feedback signals beyond which the PLL cannot adequately adjust its output signal frequency in time to compensate for the frequency difference. Increasing the natural frequency $\omega n$ of PLL 204 increases the bandwidth of the PLL 204.

Modification of the PLL parameters can be useful for a variety of purposes. For example, modifying PLL parameters allows empirical determination of a more optimal tradeoff between PLL bandwidth and PLL resolution compared with static PLL parameters. Additionally, modification of the PLL parameters provides flexibility for varying applications having differing requirements. For example, when communicating between two devices, having synchronized clock signals may be very important so that, for example, one device does not expect data before the other device can send it. Thus, it may be desirable to increase bandwidth at the expense of lower end frequency operating range to accommodate the two devices. Additionally, PLL parameters may be varied programmably which generally requires less complicated circuitry than dynamic PLL parameter modification circuits. It will be apparent to persons of ordinary skill in the art that programmably modifying PLL parameters is useful in, for example, design, testing, and implementation of clocked circuitry.

Figure 2:
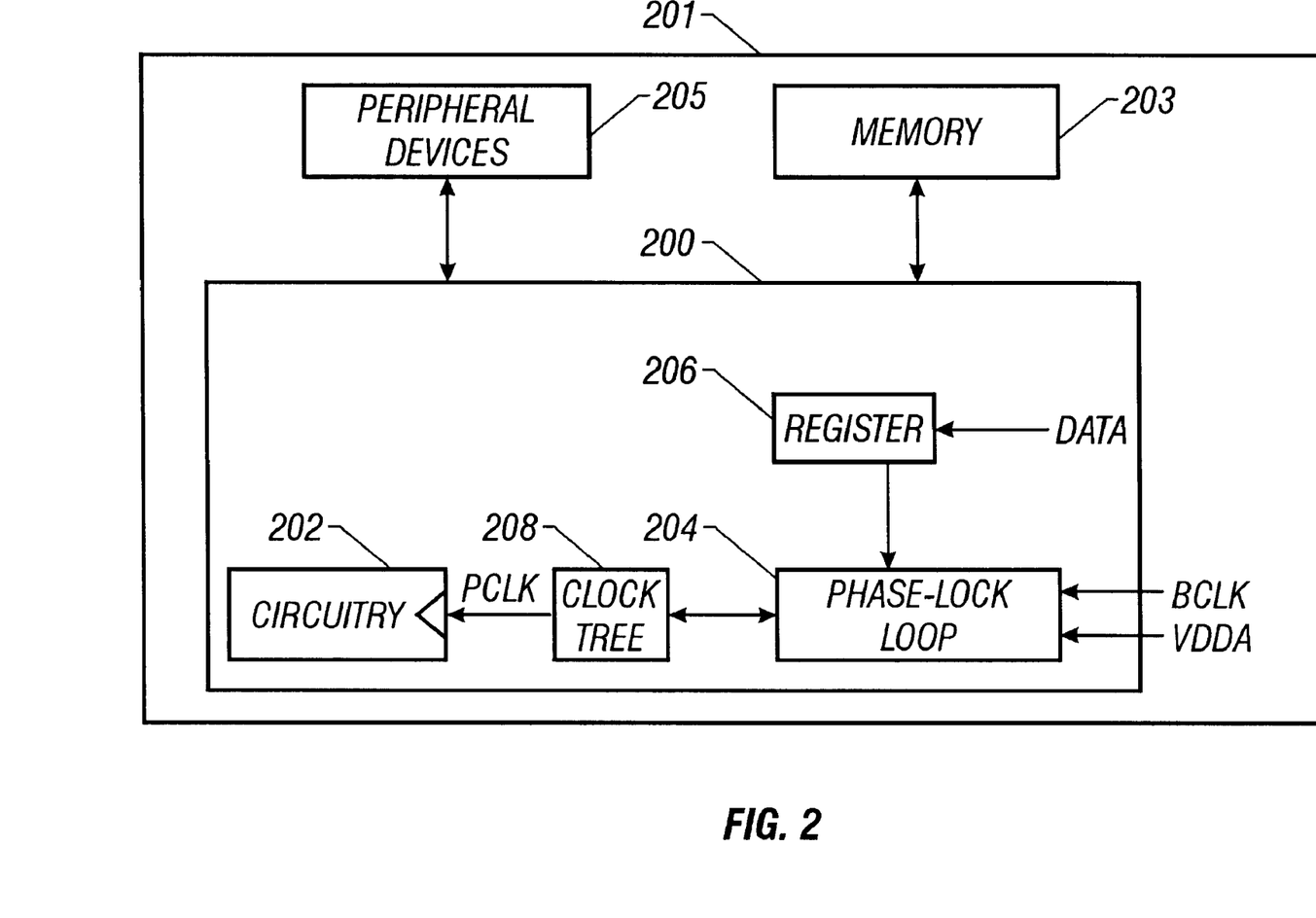
FIG. 2 illustrates an electronic system having a phase lock loop with variable parameters.

Referring to FIG. 2, an electronic system 201 includes a processor 200 connected to a memory 203 and to peripheral devices 205, which may be, for example, any input/output devices. Processor 200 includes circuitry 202 having, for example, latches that respond to clock signals received from phase-locked loop 204. Processor 200 may be any processor such as a microprocessor manufactured by Advanced Micro Devices of Sunnyvale, Calif. In normal operation, the phase-locked loop 204 and clock tree 208 provide a periodic output processor clock signal PCLK to circuitry 202 in phase with an externally received periodic reference clock signal BCLK. The processor clock signal PCLK frequency is generally a multiple of the reference clock signal BCLK signal, which may, for example, be 100 MHz. For example, the processor clock signal PCLK may be a 3X signal of the reference clock signal BCLK, i.e. three times the frequency of reference clock signal BCLK. VDDA is a filtered voltage source signal provided by an external power supply (not shown).

Register 206 receives the DATA signal which may be, for example, scanned into processor 200 in a well-known manner during testing or provided from other well-known sources such as from a random access memory. The data in register 206 includes PLL parameter modification data which is used to selectively modify parameters of PLL 204.

Figure 3:
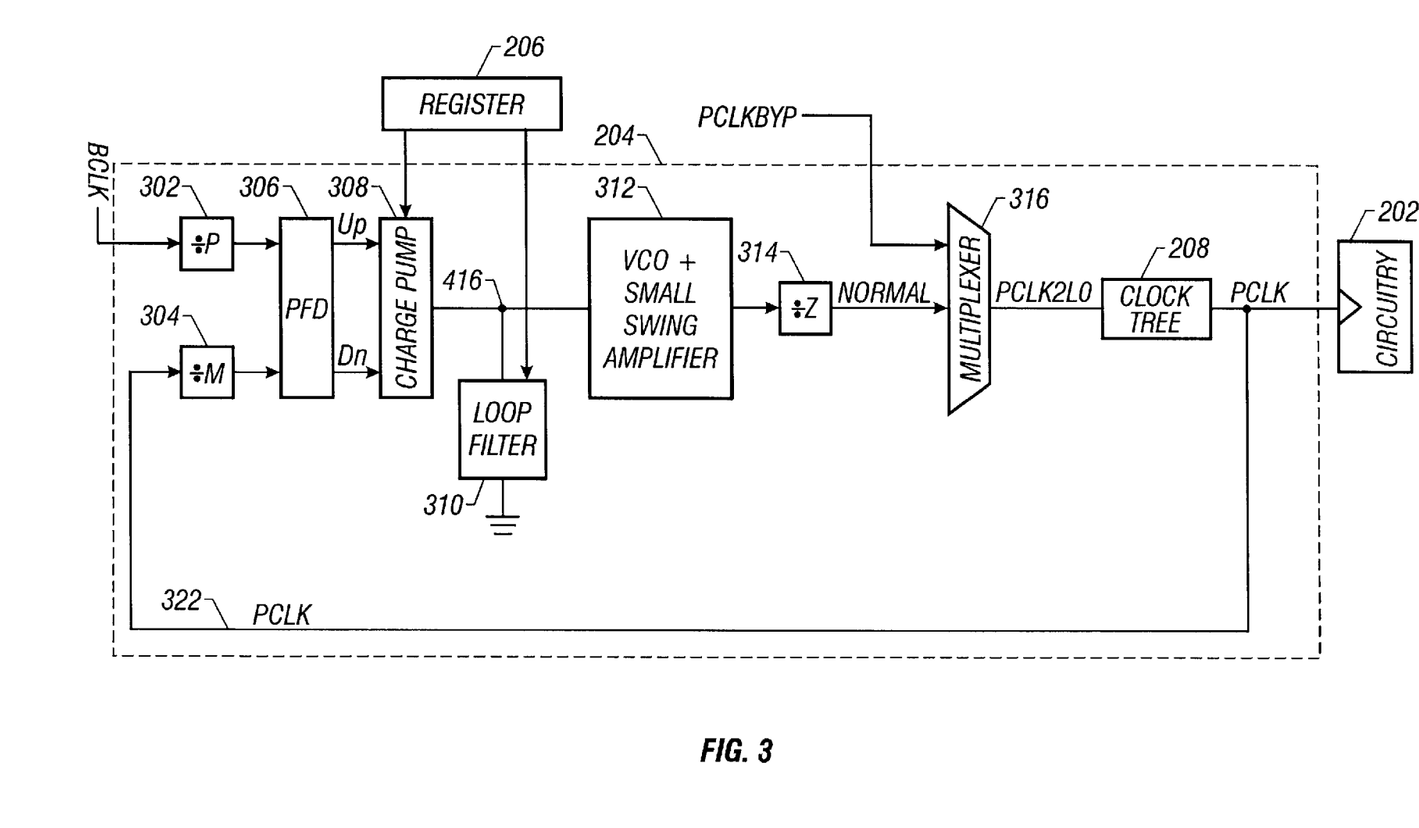
FIG. 3 illustrates an embodiment of the phase lock loop of FIG. 2 having programmable register controlled PLL parameters.

Referring to FIG. 3, the reference clock signal BCLK may be a bus clock signal and is, thus, generally an M/P multiple of the processor clock signal PCLK, where M may be, for example, five, and P may be, for example, two. Divide by P circuit 302 divides reference clock signal BCLK by P, and divide by M unit 304 divides processor clock signal PCLK by M so that phase detector PFD 306 accurately detects any phase difference between BCLK divided by P (BCLK/P) and processor clock signal PCLK divided by M (PCLK/M). The phase detector PFD 306 provides Up and Dn (down) control signals to charge pump 308 when PCLK lags and leads, respectively, reference clock signal BCLK. Loop filter 310 is connected to an output terminal of charge pump 308 and an input terminal of VCO 312 at node 416. The charge pump 308 provides a programmably variable pump current Ipump to loop filter 310 in accordance with control signals Up and Dn. When control signal Up is received by charge pump 308, charge pump 308 provides control current signal Ipump as current Iup to loop filter 310, and when control signal Dn is received by charge pump 308, charge pump 308 provides control current signal Ipump as current Idn to loop filter 310. The Iup and Idn control currents are modifiable in accordance with data stored in memory 206 which may be a register.

The control current Ipump controls the output voltage of low pass filter 310 which filters the Ipump output signal. Control current Ipump controls the charge of capacitors in loop filter 310 which in turn controls the input control voltage to VCO and small swing amplifier (VCO) 312. VCO 312 adjust its output clock signal in a well-known manner in accordance with the control voltage output signal of charge pump 308. A divide by Z circuit 314 decreases the VCO 312 output signal by Z to generate output signal NORMAL, where Z is a real number, such as an integer, and is, for example, 2. It will be recognized by those of ordinary skill in the art that well-known components of phase-locked loop 204 may be implemented in a multitude of well-known ways and input and output signals may have any number of desired frequencies.

Mode select circuitry (not shown) selects one of the input signals NORMAL or PCLKBYP to multiplexer 316 to pass through as clock signal PCLK2L0. PCLK2L0 is distributed through clock tree buffers 208. Due to propagation delays of clock tree 208, PCLK is a delayed version of PCLK2L0 and provides a clock signal to processor circuitry 202. PCLK is fed back to divide by M unit 304. An embodiment of mode select circuitry 206 and test clock tree 208 is illustratively described in concurrently filed U.S. patent application Ser. No. 08/938,184, filed Sep. 26, 1997 entitled "TEST CLOCK MODES" by Matthew P. Crowley and Darren S. Faulkner, and incorporated by reference herein in its entirety.

Figure 4A:
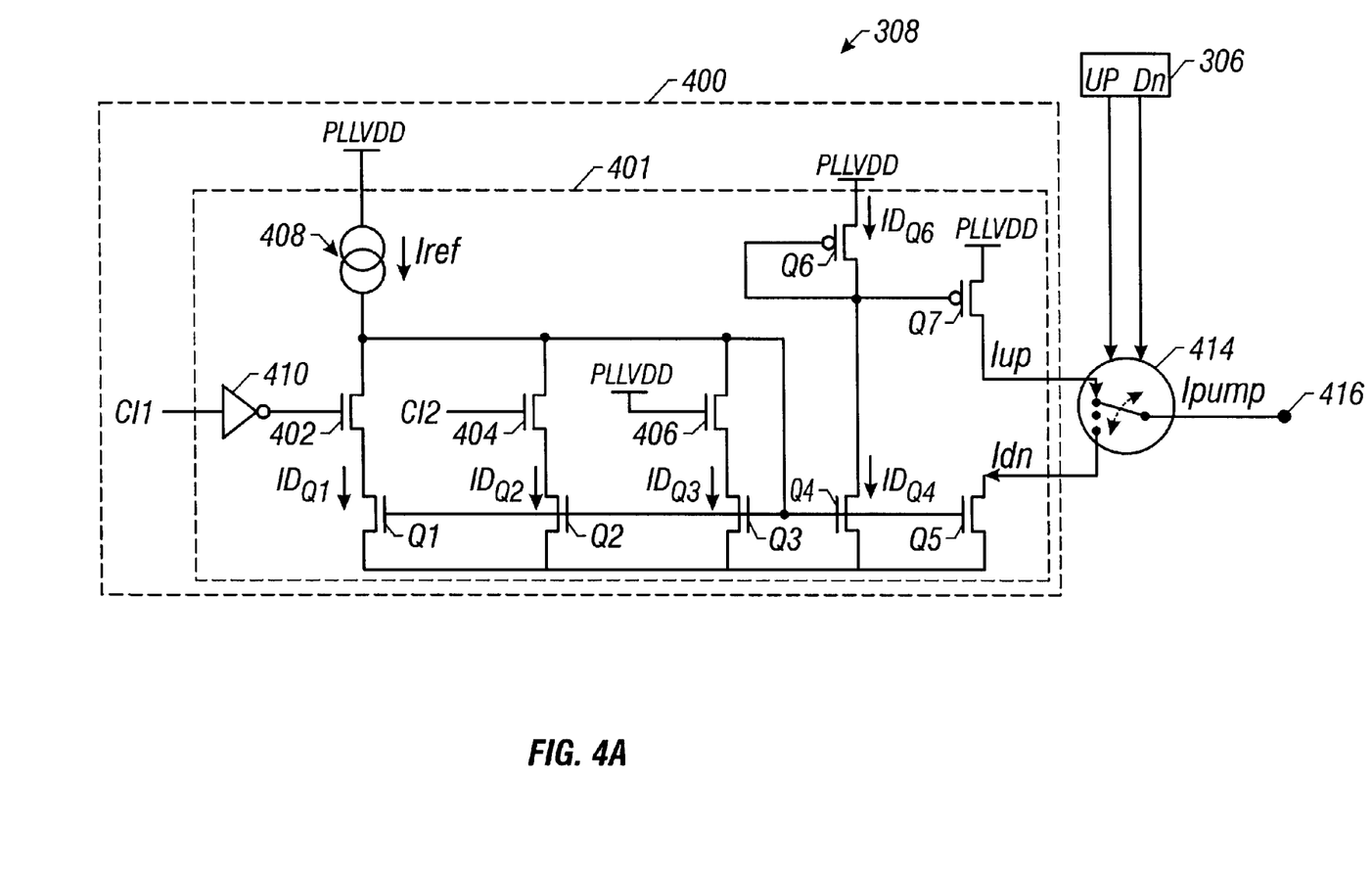
FIG. 4A illustrates an embodiment of a charge pump of the PLL of FIG. 2 having a programmable control current source.

Referring to FIG. 4A, one embodiment of charge pump 308 includes a PLL parameter modification circuit 400 which includes a programmable current source 401 which programmably modifies control currents Iup and Idn, when selected by PFD 306, in accordance with the states of input control signals CI1 and CI2. N-channel metal oxide semiconductor field effect transistors (NMOS) Q1, Q2, and Q3 are configured in parallel, with each transistor having a respective NMOS switch 402, 404, and 406, to disconnect respective drains from current reference 408. Current reference 408 may be a band gap reference which provides a stable reference current Iref which is generally independent of temperature and manufacturing process variations. Voltage terminal PLLVDD is connected through a filter (not shown) to voltage source VDDA (not shown).

Figure 5:
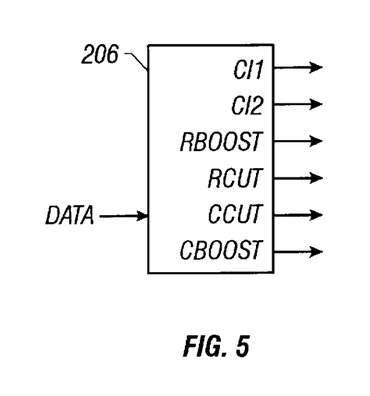
FIG. 5 illustrates a register to store PLL parameter modification data.

Referring to FIG. 5, register 206 stores bits CI1 and CI2, in accordance with information in the DATA signal, which directly reflect the states of control signals CI1 and CI2, respectively. During initialization of processor 200, all register 206 bits may be set to logical zero.

Referring to FIGS. 4A and 5, the ON (conductive) and OFF (nonconductive) states of switches 402 and 404 corresponding to the logical states of control signals CI1 and CI2 are set forth in Table 1. During initialization of processor 200, register 206 bits CI1 and CI2 may be both set to logical zero. Note that control signal CI1 is inverted by inverter 410 at the gate of switch 402.

TABLE 1

| Logical state of CI1 | Logical state of CI2 | Switch 402 | Switch 404 |
| --- | --- | --- | --- |
| 0 | 0 | ON | OFF |
| 0 | 1 | ON | ON |
| 1 | 0 | OFF | OFF |
| 1 | 1 | OFF | ON |

When switches 402, 404, and 406 are ON (conductive), transistors Q1, Q2, and Q3 are diode configured and respective drain currents $ID_{Q1}$, $ID_{Q2}$, and $ID_{Q3}$ are proportional to the width and length dimensions of transistors Q1, Q2, and Q3. Transistor Q3 is always ON when voltage terminal PLLVDD is high (2–3.3 Volts). NMOS transistors Q4 and Q5 are connected in a current mirror ratio configuration with transistors Q1, Q2, and Q3, i.e. the gates and sources of transistors Q4 and Q5 are commonly connected to the gates and sources, respectively, of transistors Q1, Q2, and Q3. Thus, the drain current $ID_{Q4}$ of transistor Q4 and the drain current Idn of transistor Q5 are proportional to the reference current Iref. Drain current $ID_{Q4}$ and control current Idn and reference current Iref adhere to the relationships:

$$ID_{Q4}=Iref*[W/L|_{Q4}]/[W/L|_{Q1}*X_{Q1}+W/L|_{Q2}*X_{Q2}+W/L_{Q3}]$$ [Equation 3], and $$Idn=Iref*[W/L|_{Q5}]/[W/L|_{Q1}*X_{Q1}+W/L|_{Q2}*X_{Q2}+W/L_{Q3}]$$ [Equation 4], where $X_{Q1}$ and $X_{Q2}$ equal one when CI1 and CI2 equal zero and one, respectively, and $X_{Q1}$ and $X_{Q2}$ equal zero when CI1 and CI2 equal one and zero, respectively. The width to length ratios of respective transistor channels are represented by $W/L|_{Qx}$.

P-channel metal oxide semiconductor field effect transistor (PMOS) Q6 is diode connected with a source connected to voltage terminal PLLVDD and a drain and gate both connected to the drain of transistor Q4. Thus, the drain current of transistor Q6 is the same as the drain current $ID_{Q4}$. PMOS transistors Q6 and Q7 are configured in a current mirror arrangement so that the drain control current Iup of transistor Q7 and drain current $ID_{Q4}$ adhere to the relationship:

$$Iup=ID_{Q6}*W/L|_{Q7}/W/L|_{Q6}=ID_{Q4}*W/L|_{Q7}/W/L|_{Q6}$$ [Equation 5].

Exemplary width to length ratios of transistors Q1, Q2, Q3, Q4, Q5, Q6, and Q7 are provided in Table 2.

TABLE 2

| Transistor | Width/length ratio |
| --- | --- |
| Q1 | 100/1 |
| Q2 | 100/1 |
| Q3 | 50/1 |
| Q4 | 100/1 |
| Q5 | 100/1 |

TABLE 2-continued

| Transistor | Width/length ratio |
|---|---|
| Q6 | 100/1 |
| Q7 | 100/1 |

Using the exemplary information in Table 2 and Equations 3, 4, and 5 it is apparent that in this embodiment control current Idn equals the control current Iup. The relationship of control currents Iup and Idn to the reference current Iref for different programmable settings of control signals CI1 and CI2 (Table 1) is given in Table 3.

TABLE 3

| logical state of CI1 | logical state of CI2 | Idn = Iup |
|---|---|---|
| 0 | 0 | Iref/1.5 |
| 0 | 1 | Iref/2.5 |
| 1 | 0 | Iref/0.5 |
| 1 | 1 | Iref/1.5 |

Programmable current source 401 couples either voltage source PLLVDD or ground to switch 414 to either source current to or sink current from switch 414, respectively. PFD 306 selects either control current Iup or control current Idn to pass from charge pump 308. When PFD 306 detects that the phase of PCLK lags reference clock signal BCLK, PFD 306 enables switch 414 to source control current Iup from charge pump 308. When PFD 306 detects that the phase of PCLK leads reference clock signal BCLK, PFD 306 enables switch 414 to sink control current Idn into charge pump 308. Switch 414 has a third position at which neither Iup or Idn is provided from charge pump 308. Switch 414 may include complimentary metal oxide semiconductor pass gates to selectively allow propagation of control current signals Iup and Idn. Control currents Iup and Idn charge and discharge, respectively, capacitor C1 and C3 (FIG. 6) of loop filter 310, and the voltage across loop filter 310 provides a control voltage signal to VCO 312.

By modifying the values of control signals CI1 and CI2 stored in register 206, control current Idn and Iup are also modified. Thus, in the embodiment of FIG. 4A, the PLL parameter modification circuit 400 includes a programmable current source response to control signals CI1 and CI2. By modifying the states of control signals CI1 and CI2 with corresponding register 206 bits CI1 and CI2, control currents Idn and Iup may be tailored to modify the natural frequency ωn of PLL 204 in accordance with Equation 1, where current Ipump equals control current Iup when PFD 306 selects control current Iup to increase the control voltage to VCO 312 and Ipump equals control current Idn when PFD 306 selects control current Idn to decrease the control voltage to VCO 312. Changes in the natural frequency ωn affect, for example, the PLL 204 long term jitter, bandwidth, operating range and stability, and lock time parameters as described above. For example, PLL 204 bandwidth may be adjusted to sufficiently accommodate frequency and, thus, phase changes between PCLK/M and BCLK/P. Additionally, VCO 312 resolution and VCO 312 noise generation may be minimized by selecting the minimum control currents Idn and Iup that provide sufficient PLL 204 bandwidth. Thus, within the limits of control currents Iup and Idn, multiple parameters of PLL 204 may be modified. It will be understood by persons of ordinary skill in the art that other programmable circuitry and current mirror ratios may be utilized to accommodate any number of Iup and Idn current magnitudes and ranges.

Figure 4B:
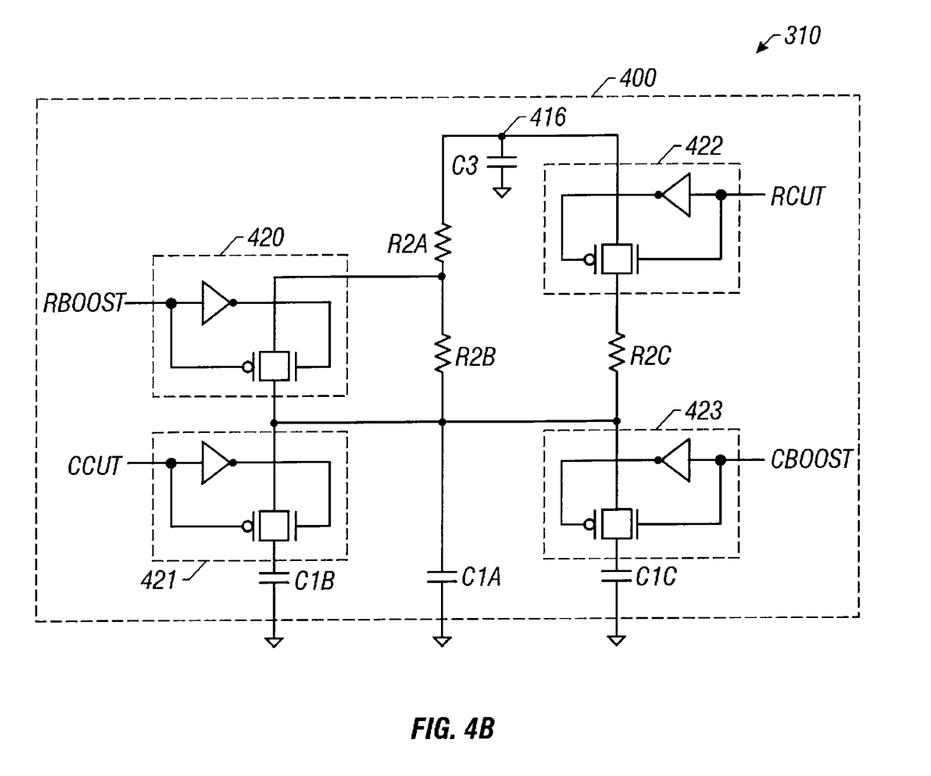
FIG. 4B illustrates an embodiment of a programmable loop filter of the PLL of FIG. 2.

Referring to FIGS. 4B and 5, the PLL parameter modification circuit 400 may also include a variable parameter loop filter 310 in combination or independent of the programmable current source 401. Register 206 also includes bits RBOOST, RCUT, CCUT, and CBOOST which modify the effective resistance and capacitance of loop filter 310. Bit signals RBOOST and CCUT respectively control the conductivity of pass gates 420 and 421 which each include an input terminal coupled to a P-channel MOSFET gate and, via an inverter, to an N-channel MOSFET gate. Bit signals RCUT and CBOOST respectively control the conductivity of pass gates 422 and 423 which each include an input terminal coupled to an N-channel MOSFET gate and, via an inverter, to an P-channel MOSFET gate.

Figure 6:
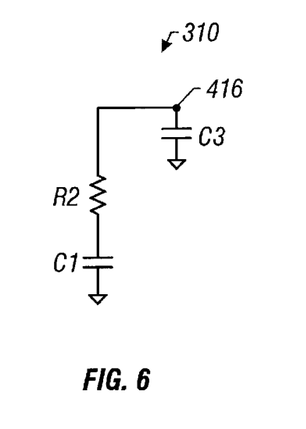
FIG. 6 illustrates an equivalent circuit of a programmed loop filter of the PLL of FIG. 4B.

Referring to FIGS. 4B, 5, and 6, an equivalent circuit of loop filter 310 is illustrated where the variable value of resistor R2 is determined by the states of bit signals RBOOST and RCUT as shown in Table 4. A logical zero bit signal RBOOST inserts resistor R2B in series with resistor R2A, and a logical one bit signal RCUT inserts resistor R2C in parallel with resistor R2A and with resistor R2B when selected by RBOOST.

TABLE 4

| logical state of RBOOST | logical state of RCUT | Equivalent resistor R2 value (FIG. 6) |
|---|---|---|
| 0 | 0 | R2A |
| 0 | 1 | R2A ∥ R2C |
| 1 | 0 | R2A + R2B |
| 1 | 1 | (R2A + R2B) ∥ R2C |

The equivalent circuit of loop filter 310 is illustrated where the variable value of capacitor C1 is determined by the states of bit signals CBOOST and CCUT as shown in Table 5. A logical one bit signal CBOOST inserts capacitor C1C in parallel with capacitor C1A, and a logical zero bit signal CCUT inserts capacitor C1B in parallel capacitor C1A when selected by CBOOST.

TABLE 5

| logical state of CBOOST | logical state of CCUT | Equivalent capacitor C1 value (FIG. 6) |
|---|---|---|
| 0 | 0 | CA1 + C1B |
| 0 | 1 | C1A |
| 1 | 0 | C1A + C1B + C1C |
| 1 | 1 | C1A + C1C |

Exemplary values of resistors R2A, R2B, and R2C are 12.25 kohms each. Exemplary values of capacitors C1A, C1B, C1C, and C3 are 25.8 pF, 25.8 pF, 51.6 pF, and 8.6 pF, respectively.

Modifying the value of resistor R2 and capacitor C1 with register 206 bits RBOOST, RCUT, CCUT, and CBOOST in accordance with Tables 4 and 5, respectively, effectively modifies the PLL 204 parameters. By modifying the states of control signals CBOOST and CCUT with corresponding register 206 bits CBOOST and CCUT, respectively, loop filter 310 capacitor C1 (FIG. 6) may be tailored to modify the natural frequency ωn of PLL 204 in accordance with Equation 1. Changes in the natural frequency ωn affect, for example, the PLL 204 long term jitter, bandwidth, operating range and stability, and lock time parameters as described above. By modifying the states of control signals RBOOST and RCUT with corresponding register 206 bits RBOOST and RCUT, respectively, loop filter 310 resistor R2 (FIG. 6) may be tailored to modify the damping factor ζ of PLL 204 in accordance with Equation 2. Changes in the damping factor ζ affect, for example, the PLL 204 operational parameters as described above. It will be understood by persons of ordinary skill in the art that loop filter 310 may be modified in any number of ways to selectively change reactive and resistance impedances to alter PLL 204 loop parameters to accommodate multiple applications.

While the invention has been described with respect to the embodiments and variations set forth above, these embodiments and variations are illustrative and the invention is not to be considered limited in scope to these embodiments and variations. For example, specific device dimensions may be altered to provide different programmable control currents Iup and Idn. Furthermore, additional selectable, diode connected transistors may be inserted in the current mirror of FIG. 4 and additional bits may be added to register 206 and coupled to the additional transistors to increase the number of control currents Idn and Iup ratios to control current Iref. Accordingly, various other embodiments and modifications and improvements not described herein may be within the spirit and scope of the present invention, as defined by the following claims.

What is claimed is:

1. An electronic system comprising:
    a phase-locked loop (PLL) having a PLL parameter modification circuit to receive PLL parameter modification data and to modify an operational parameter of the PLL in accordance with the PLL parameter modification data;
    wherein the PLL parameter modification circuit further comprises:
        a programmable current source to provide at least an UP charge pump output control signal and a DOWN charge pump output control signal; and
    wherein the programmable current source further comprises:
        a control current source to provide a reference current;
        an UP control current source to provide the UP charge pump output control signal;
        a DOWN control current source to provide the DOWN charge pump output control signal; and
        programmable circuitry to modify a ratio between the reference current and the UP and DOWN charge pump output control signals, wherein the ratio between the reference current and the UP and DOWN charge pump output control signals is a programmable ratio in accordance with the parameter modification data.

2. The electronic system as in claim 1 further comprising:
    a programmable register for storing the PLL parameter modification data and providing the PLL parameter modification data to the PLL parameter modification circuit.

3. The electronic system as in claim 1 further comprising:
    a processor having circuitry coupled to the PLL;
    a memory coupled to the processor; and
    an input/output device coupled to the processor.

4. The electronic system as in claim 1 wherein the programmable circuitry comprises programmable current mirrors.

5. A processor comprising:
    a register for storing phase-locked loop (PLL) parameter modification data; and
    a PLL comprising:
        input terminals to receive a first signal and a second signal;
        a phase detector, coupled to the input terminals, to detect any change in a predetermined phase relationship between the first and second signals and to provide a control signal responsive to any change in the predetermined phase relationship;
        a charge pump coupled to the phase detector to receive the phase detector control signal and having an output control signal responsive to the phase detector control signal wherein the charge pump further includes a PLL modification circuit capable of modifying the charge pump output control signal at least into an UP charge pump output control signal and a DOWN charge pump output control signal in accordance with the PLL parameter modification data;
        a voltage controlled oscillator (VCO) having an output signal with a frequency of the VCO output signal being responsive to the charge pump output control signal; and
    wherein the PLL parameter modification circuit further comprises:
        a programmable current source; and
    wherein the programmable current source further comprises:
        a current source to provide a reference current;
        an UP control current source to provide the UP charge pump output control signal;
        a DOWN control current source to provide the DOWN charge pump output control signal; and
        programmable circuitry to modify a ratio between the reference current and the UP and DOWN charge pump output control signals, wherein the ratio between the reference current and the UP and DOWN charge pump output control signals is a programmable ratio.

6. The processor as in claim 5 further comprising:
    a loop filter having a first node coupled to an input node of the VCO and having a programmable impedance.

7. The processor as in claim 5 wherein the programmable circuitry comprises programmable current mirrors.

8. The processor as in claim 7 wherein at least one of the programmable current mirrors comprises:
    a first transistor having a gate coupled to the current source and to a control terminal of the DOWN control current source;
    a first switch coupled between a drain and the gate of the first transistor;
    a second transistor having a gate coupled to the first transistor gate; and
    a second switch coupled between a drain and the gate of the second transistor, wherein conductivity of the first and second switches is determined by the PLL modification data.

9. The processor as in claim 8 wherein the programmable current source further comprises:
    a third transistor having a gate coupled to the gate of the first transistor, wherein the first, second, and third transistors have sources coupled to a common potential reference terminal;
    a diode connected fourth transistor having a source coupled to a voltage source terminal and a drain coupled to the drain of the third transistor;
    wherein the UP control current source further comprises a fifth transistor having a gate coupled to a gate of the fourth transistor, a source coupled to the voltage source terminal, and a drain; and wherein the DOWN control current source further comprises a sixth transistor having a gate coupled to the gate of the third transistor, a source coupled to the source of the third transistor, and a drain.

10. The processor as in claim 9 further comprising a switch coupled to the drains of the UP and DOWN control current sources, wherein the phase detector selects the UP control current source to provide the UP charge pump output control signal to increase the VCO output signal frequency and selects the DOWN current control source to provide the DOWN charge pump output control signal to decrease the VCO output signal frequency.

11. An apparatus comprising:
a phase-locked loop having a charge pump coupled to a loop filter and a voltage controlled oscillator coupled to the loop filter, and the phase-locked loop having a natural frequency, ωn, defined at least approximately by:

$$\omega n = \sqrt{\frac{(Ipump)Kosc}{2\pi MZ(C1)}}; \text{ and}$$

parameter modification circuitry to modify in accordance with programmable data one or both of the Ipump and C1 variables, wherein Ipump is a charge pump current supplied to the loop filter, Kosc is a voltage gain of the voltage controlled oscillator, Z is any frequency divisor of an output signal of the voltage controlled oscillator, M is any feedback divisor of the phase-locked loop, and C1 is a capacitance of the loop filter;
wherein the parameter modification circuitry further comprises:
a programmable current source to provide at least an UP charge pump output control signal and a DOWN charge pump output control signal; and
wherein the programmable current source further comprises:
a current source to provide a reference current;
an UP control current source to provide the UP charge pump output control signal;
a DOWN control current source to provide the DOWN charge pump output control signal; and
programmable circuitry to modify a ratio between the reference current and the UP and DOWN charge pump output control signals, wherein the ratio between the control current and the UP and DOWN charge pump output control signals is a programmable ratio in accordance with the parameter modification data.

12. The apparatus as in claim 11 wherein the phase-locked loop further includes a damping factor, ζ, defined at least approximately by:

ζ=(ωn)(τ)/2;

and wherein the parameter modification circuitry further being capable of modifying the τ variable of the damping factor, wherein τ=R2*C1 and R2 is a resistance of the loop filter.

13. A method comprising:
programmably modifying phase-locked loop operational parameters in accordance with parameter modification data;
wherein programmably modifying phase-locked loop operational parameters comprises:

modifying a charge pump output current; and
providing a control voltage, corresponding to the modified charge pump output current, to a voltage controlled oscillator;
wherein modifying the charge pump output current comprises:
providing a reference current;
providing an UP charge pump output control signal;
providing a DOWN charge pump output control signal;
modifying a programmable ratio between the reference current and the UP and DOWN charge pump output control signals to generate the modified charge pump output current.

14. The method as in claim 13 wherein the phase-locked loop operational parameters comprise a natural frequency of the phase-locked loop and a damping factor of the phase-locked loop.

15. The method as in claim 13 wherein modifying the charge pump output current comprises:
providing a reference current to a current mirror circuit that includes a plurality of parallel coupled, diode coupled transistors, wherein at least one of the diode coupled transistors includes a switch coupled between a current terminal and control terminal of the transistor, and the output current of the current mirror is the charge pump output current; and
altering conductivity of the switch in accordance with a programmable signal to modify the output current of the current mirror.

16. The method as in claim 13 wherein programmably modifying phase-locked loop operational parameters comprises:
providing the modified charge pump output current to a loop filter;
modifying a transfer function of the loop filter; and
providing the control voltage to the voltage controlled oscillator in accordance with the modified charge pump output current and the loop filter transfer function.

17. The method as in claim 16 wherein modifying a transfer function of the loop filter comprises:
modifying a resistance of the loop filter.

18. The method as in claim 17 wherein modifying a transfer function of the loop filter further comprises:
modifying a capacitance of the loop filter.

19. The method as in claim 16 wherein modifying a transfer function of the loop filter comprises:
modifying a capacitance of the loop filter.

20. A method comprising
programmably modifying phase-locked loop operational parameters in accordance with parameter modification data;
wherein programmably modifying phase-locked loop operational parameters comprises:
modifying a charge pump output current; and
providing a control voltage, corresponding to the modified charge pump output current, to a voltage controlled oscillator;
wherein modifying the charge pump output current comprises:
providing a reference current to a current mirror circuit that includes a plurality of parallel coupled, diode coupled transistors, wherein at least one of the diode coupled transistors includes a switch coupled between a current terminal and control terminal of the transistor, and the output current of the current mirror is the charge pump output current; and altering conductivity of the switch in accordance with a programmable signal to modifying the output current of the current mirror.

21. The method as in claim 20 wherein programmably modifying phase-locked loop operational parameters comprises:

providing the modified charge pump output current to a loop filter;

modifying a transfer function of the loop filter; and providing the control voltage to the voltage controlled oscillator in accordance with the modified charge pump output current and the loop filter transfer function.

22. The method as in claim 20 wherein the phase-locked loop operational parameters comprise a natural frequency of the phase-locked loop and a damping factor of the phase-locked loop.

* * * * *